United States Patent
Chung et al.

(10) Patent No.: US 6,790,772 B2
(45) Date of Patent: Sep. 14, 2004

(54) DUAL DAMASCENE PROCESSING METHOD USING SILICON RICH OXIDE LAYER THEREOF AND ITS STRUCTURE

(75) Inventors: Chia-chi Chung, Hsinchu (TW); Shin-Yi Tsai, Hsinchu (TW)

(73) Assignee: Macronix International Co., Ltd., Hsinchu (TW)

( * ) Notice: Subject to any disclaimer, the term of this patent is extended or adjusted under 35 U.S.C. 154(b) by 48 days.

(21) Appl. No.: 10/141,123

(22) Filed: May 9, 2002

(65) Prior Publication Data

US 2003/0211725 A1 Nov. 13, 2003

(51) Int. Cl.[7] ............................................. H01L 21/31
(52) U.S. Cl. ........................ 438/638; 438/700; 438/778
(58) Field of Search ........................ 438/638, FOR 355, 438/FOR 489, 693, 700, 778

(56) References Cited

U.S. PATENT DOCUMENTS

| | | | |
|---|---|---|---|
| 6,348,407 B1 * | 2/2002 | Gupta et al. ................ | 438/637 |
| 6,365,327 B1 * | 4/2002 | Chittipeddi et al. ........ | 430/313 |
| 2001/0045623 A1 * | 11/2001 | Yuasa et al. ................. | 257/646 |
| 2002/0155695 A1 * | 10/2002 | Lee et al. .................... | 438/622 |
| 2003/0127422 A1 * | 7/2003 | Tsuchiya ....................... | 216/2 |

* cited by examiner

*Primary Examiner*—George Fourson
*Assistant Examiner*—Joannie Adelle Garcia
(74) *Attorney, Agent, or Firm*—Rosenberg, Klein & Lee

(57) ABSTRACT

The present invention generally relates to a dual damascene processing method using a silicon rich oxide (SRO) layer thereof and its structure. In the dual damascene process, a first dielectric layer, an etching stop layer, such as a silicon rich oxide layer, and a second dielectric layer are sequentially formed on a semiconductor substrate, which is provided with metal connections therein. Then, the present invention utilizes photolithography and etching technique to obtain a dual damascene structure profile having a trench and a via hole. The present invention uses the silicon rich oxide layer as the etching stop layer so as the present invention can achieve a better trench microloading and better bottom profile. Beside, the present invention does not increase the dielectric constant index (K) of the inter metal dielectric (IMD).

20 Claims, 7 Drawing Sheets

DUAL DAMASCENE PROCESSING METHOD USING SILICON RICH OXIDE LAYER THEREOF AND ITS STRUCTURE

BACKGROUND OF THE INVENTION

1. Field of the Invention

The present invention generally relates to a dual damascene processing method, and more particularly relates to a dual damascene processing method utilizing a silicon rich oxide (SRO) layer as an etching stop layer thereof and its structure.

2. Description of the Prior Art

As the level of integration of integrated circuits increases, the integrated circuits (IC) design becomes smaller and smaller in the MOS manufacture process. Besides, under the urgent demand of the faster transmission speed, integrated circuits devices utilizing copper as metal interconnections can bear the higher integrated circuits array so as to deeply reduce the number of the interconnections reduce the manufacture cost and improve the calculating speed of the computer, and can obtain a better metal reliability. Hence, devices utilizing copper as the interconnections can provide the advantages of longer product lift and reliability.

When the metal-oxide-semiconductor (MOS) manufactures get into the very large scale integrated circuits (VLSI) technique, the metallization process becomes an important and key process. As the level of integration of IC devices increases and the critical dimension shrinks, the current density of devices simultaneously increases to cause many problem of the metal interconnections. Usually, copper deposited by chemical vapor deposition (CVD) method is applied to fill via contact via hole or used as the interconnections in IC devices. However, owing to the dual damascene process can replace the conventional plasma etching method to obtain the metal copper conductor, so as the dual damascene technique is gradually become an important step of the metallization process. In the dual damascene process, a conventional dry etching process is performed to complete the plug, such as a vertical conductor, and the trench for connection. After, using the chemical vapor deposition method is to fill into a barrier layer and then also to fill into a copper membrane material. Last, performing a chemical mechanism polishing step is to obtain a flat surface and to simultaneously complete the vertical and horizontal connection of the conductor.

The point of another technique of the dual damascene process mentioned above is the etching technique for etching the trench for filling the metal conductor. In the preceding process of the dual damascene process, there are two conventional methods for forming the trench of the dual damascene structure. One process method is utilizing the silicon nitride (SiN) layer as the etching stop layer between the upper dielectric layer and the lower dielectric layer in the step of etching the trench via contact. The process method using the silicon nitride layer as the etching stop layer has some disadvantages of the problem of the high dielectric constant index (K) of the intermetal dielectric (IMD) resulting in the high capacitance (C) of the dielectric and causing the noise of the dielectric to obtain a bad isolating effect of the dielectric. Another process method does not utilize the etching stop layer in the step of etching the trench via contact. However, the process method has disadvantages of bad controlling of the trench profile and depth, so it will easily cause the difficult in the manufacturing process.

Obviously, the main spirit of the present invention is to provide a dual damascene processing method using a silicon rich oxide (SRO) layer thereof, and then some disadvantages of well-known technology are overcome.

SUMMARY OF THE INVENTION

The primary object of the present invention is to provide a dual damascene processing method using a silicon rich oxide (SRO) layer thereof so as to obtain a better trench profile and a better depth control. Besides, the present invention does not to increase the dielectric constant index (K) of the inter metal dielectric (IMD).

Another object of the present invention is to use the silicon rich oxide layer as the etching stop layer in the dual damascene process so as the present invention can achieve a better trench microloading and better bottom profile Further object of the present invention is to improve the function and operation speed of the devices without increasing the processing difficult in the manufacturing process.

In order to achieve previous objects, the present invention sequentially forms a first dielectric layer, an etching stop layer, such as a silicon rich oxide layer, and a second dielectric layer on a semiconductor substrate, which is provided with metal connections therein. Then, the present invention utilizes photolithography and etching technique to form a trench and a via hole and then to obtain a dual damascene structure profile having the trench and the via hole.

Other aspects, features, and advantages of the present invention will become apparent, as the invention becomes better understood by reading the following description in conjunction with the accompanying drawings.

BRIEF DESCRIPTION OF THE DRAWINGS

The foregoing aspects and many of the accompanying advantages of this invention will become more readily appreciated as the same becomes better understood by reference to the following detailed description, when taken in conjunction with the accompanying drawings, wherein.

DESCRIPTION OF THE PREFERRED EMBODIMENT

One embodiment of the present invention is to provide a dual damascene processing method using a silicon rich oxide (SRO) layer as an etching stop layer in a trench etching step of the dual damascene preceding process. FIG. 1A, FIG. 1B, FIG. 1C, and FIG. 1D are schematic representations structures at various stages during the trench etching step in accordance one embodiment of the present invention.

Figure 1A:
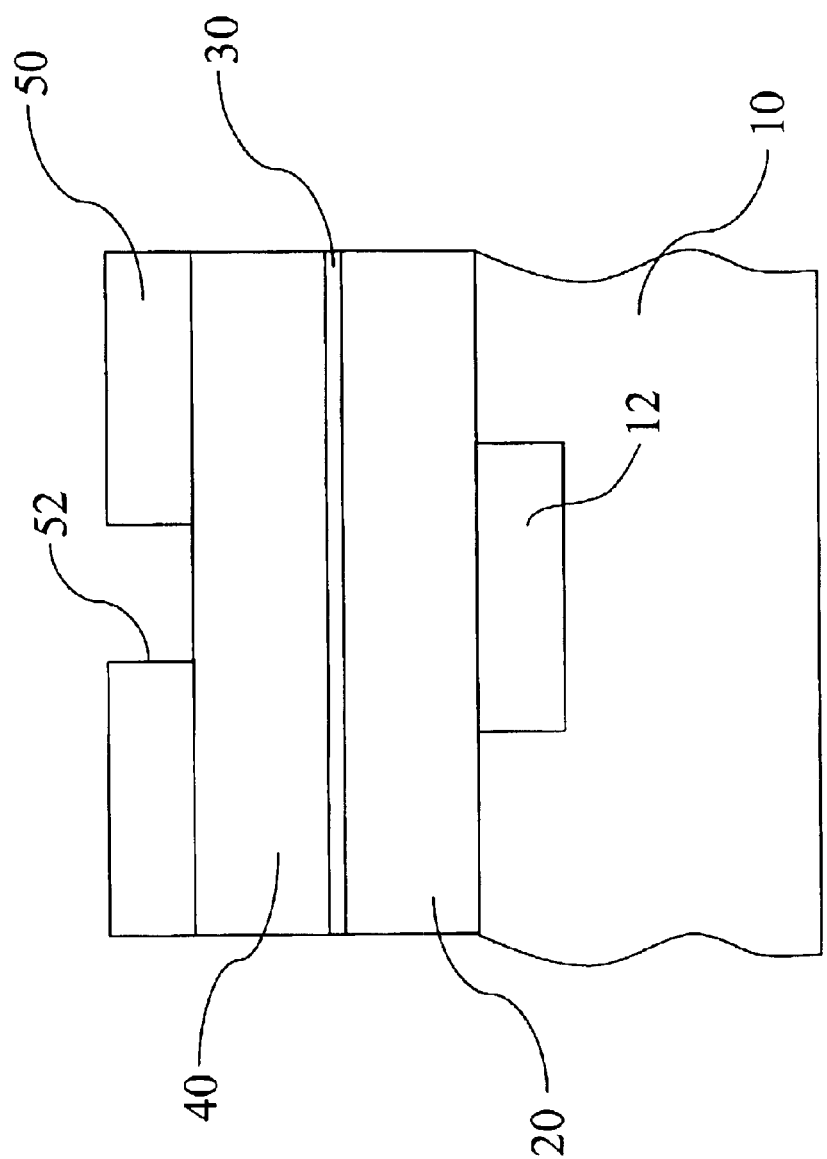
FIG. 1A, FIG. 1B, FIG. 1C, and FIG. 1D are schematic representations structures at various stages during the formulation of the dual damascene structure, in accordance of the present invention.

Referring to the FIG. 1A, a metal layer 12, which is made of copper, is formed on a semiconductor substrate 10 by using the chemical vapor deposition method, wherein the semiconductor substrate 10 is already provided with some basis metal-oxide-semiconductor (MOS) devices therein. Then, a fluorinate silicate glass (FSG) layer is formed on the metal layer 12 to use as a first dielectric layer 20, wherein the fluorinate silicate glass layer can be formed by using the chemical vapor deposition (CVD) method or the physics vapor deposition (PVD) method. Following, a silicon rich oxide layer 30 is deposited on the first dielectric layer 20 to use as an etching stop layer, wherein a thickness of the silicon rich oxide layer 30 is between about 500 angstroms to 2,000 angstroms, and then a fluorinate silicate glass (FSG) layer is deposited on the silicon rich oxide layer 30 to use as a second dielectric layer 40. Next, a first photoresist layer is coated on the surface of the second dielectric layer 40 to form a patterned first photoresist layer 50 by the photolithography and etching technique, wherein the patterned first photoresist layer 50 is provided with a smaller size of the etching contact 52 to define the desired size of the via hole.

Figure 1B:
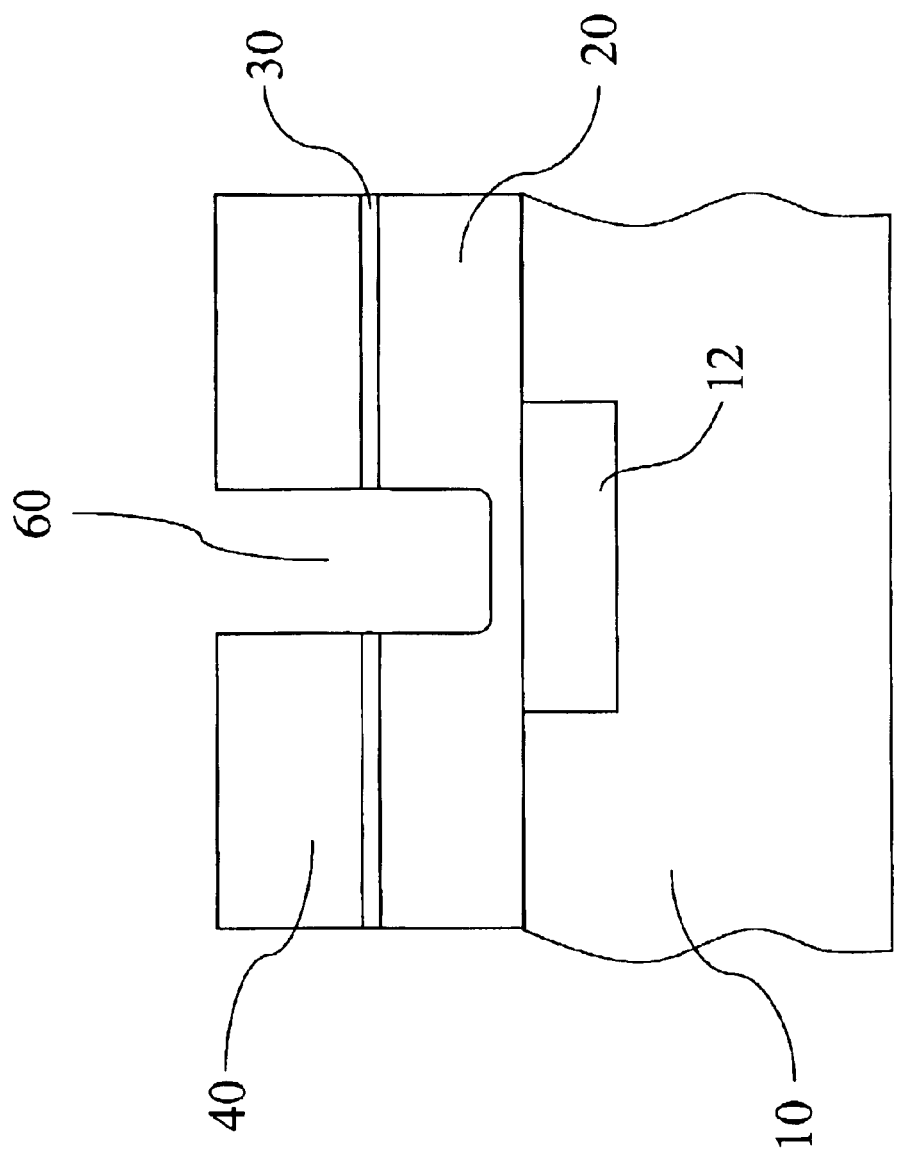

After defining the size of via hole is to use the visible etching technique to form the via hole, referring to the FIG. 1B, the patterned first photoresist layer 50 is used as a mask to remove a portion of the second dielectric layer 40, which is exposed from the etching contact 52, the silicon rich oxide layer 30, and partial depth of the first dielectric layer 20 to form a via hole 60 having some residual first dielectric layer 20 on the bottom of the via hole 60. Following, the patterned first photoresist layer 50 is removed by using the oxygen plasma etching technique.

Figure 1C:
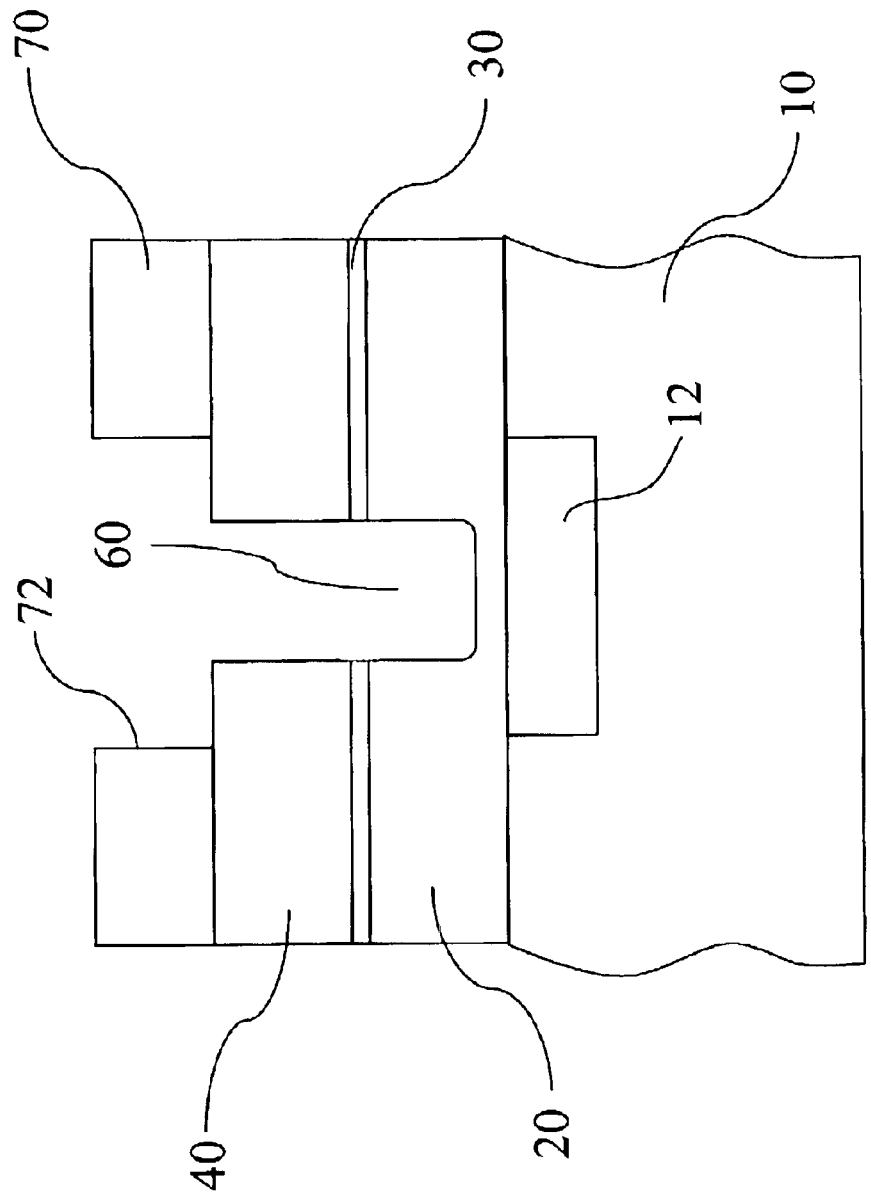

Referring to the FIG. 1C, after completing the step of removing the patterned first photoresist layer 50, a patterned second photoresist layer 70 is formed on the surface of the second dielectric layer 40, wherein the size of an etching contact 72 of the patterned second photoresist layer 70 is larger than the etching contact 52 of the patterned first photoresist layer 50 and is used as a mask in the following etching process to define the size of the trench.

Figure 1D:
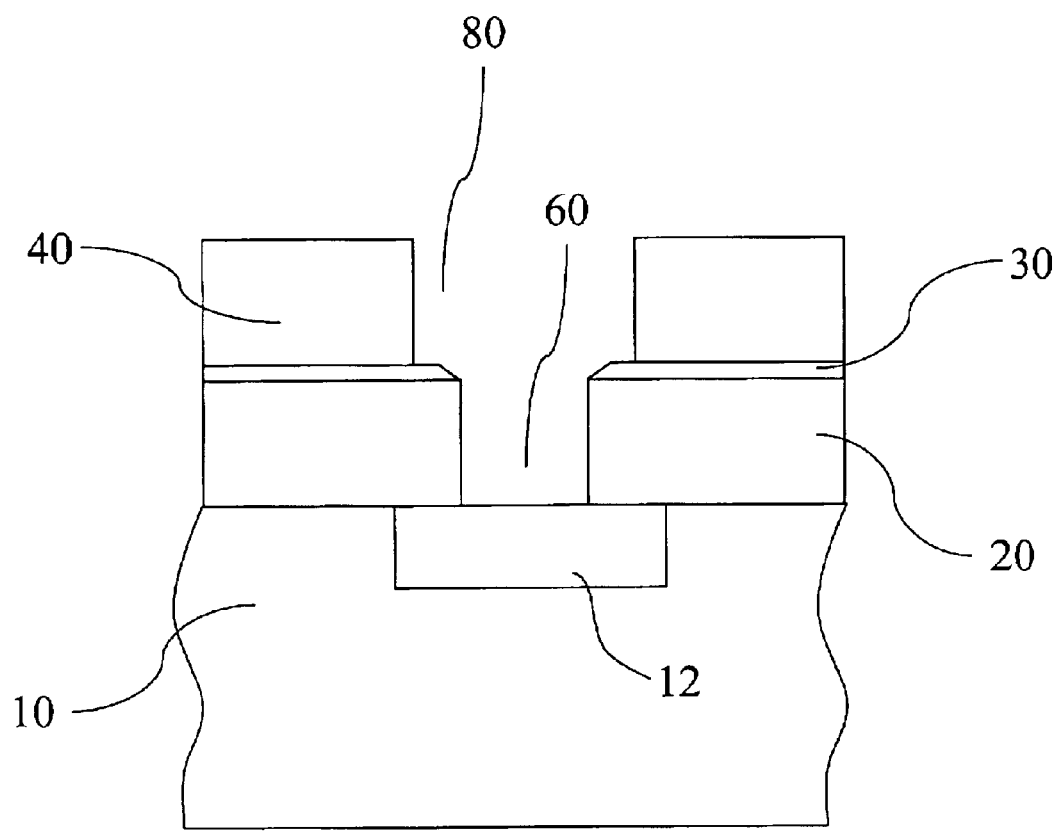

After forming the patterned second photoresist layer 70, the following step is an etching step to etch the trench by using the patterned second photoresist layer 70 as a mask to remove a portion of the second dielectric layer 40, which is exposed from the etching contact 72, and the residual first dielectric layer 20 on the via hole 60 to obtain a trench 80 structure and complete the via hole 60, such as shown in the FIG. 1D, wherein the etching step has a high selectivity of the dielectric layer to the etching stop layer and the etching selectivity is larger than 2. Hence, the present invention can provides a dual damascene structure profile having the trench 80 and the via hole 60.

Besides, the present invention can further provide a protect layer between the semiconductor substrate and the first dielectric layer or between the metal layer and the first dielectric layer so as the protect layer can protect the semiconductor substrate or the metal layer. Wherein, the reaction gases of the trench etching step are carbon fluoride ($C_4F_8$), argon (Ar), carbon monoxide (CO), and oxygen ($O_2$). On the other hand, a reflect index of the etching stop layer of the silicon rich oxide layer used in the present invention is larger than 1.66 and a dielectric constant index (K) of the silicon rich oxide layer is between about 4.

Figure 2A:
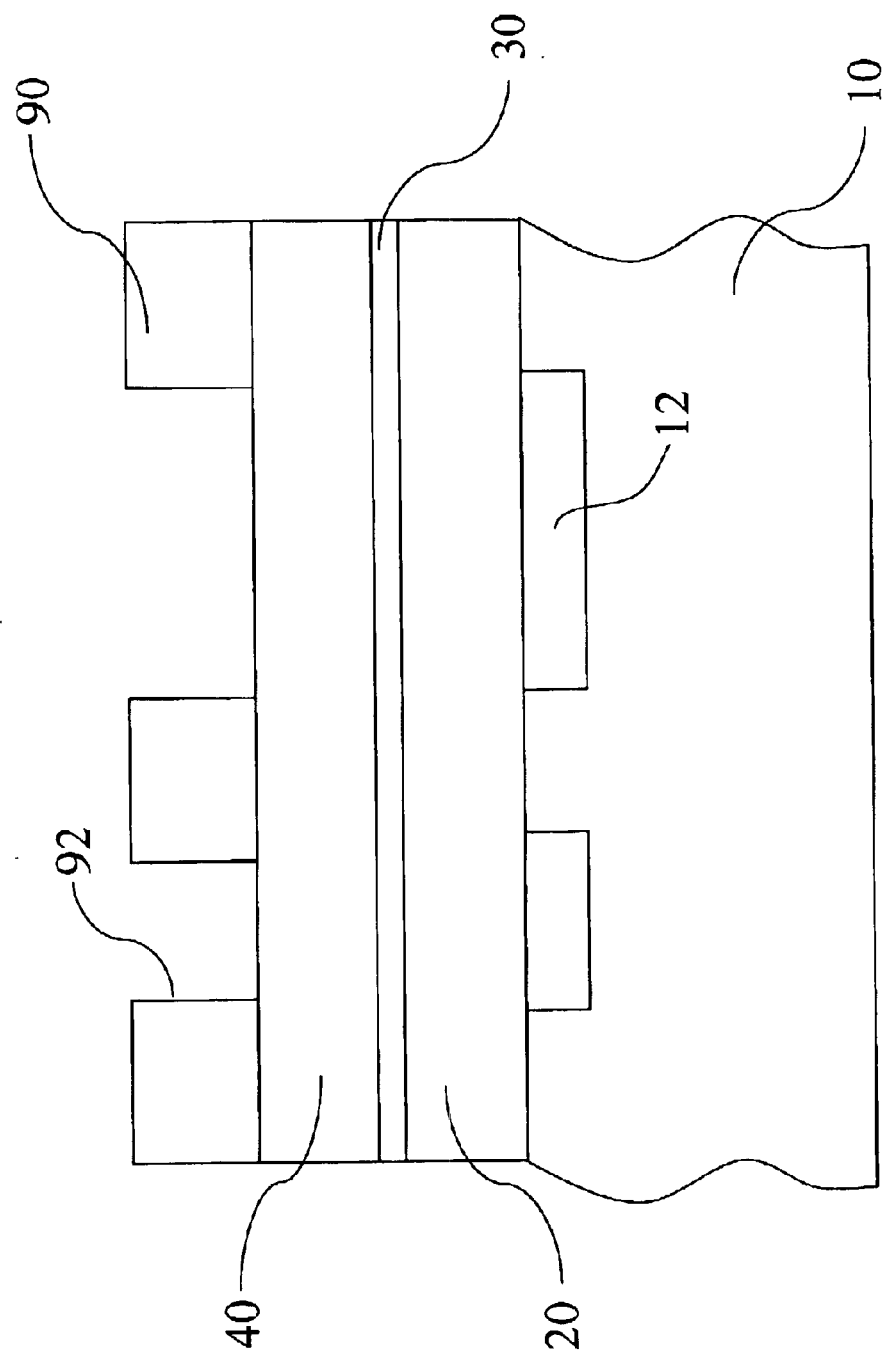
FIG. 2A, FIG. 2B, and FIG. 2C are schematic representations structures at various stages during the formulation of the dual damascene structure, in accordance with another preferred embodiment of the present invention.

Besides the embodiment mentioned above, the present invention can achieve the same dual damascene structure by using different dual damascene processes, such as shown in the FIG. 2A. First, a semiconductor substrate 10 having a metal layer 12 thereon is provided and then the present invention utilizes the chemical vapor deposition (CVD) method or the physics vapor deposition (PVD) method to sequentially form a fluorinate silicate glass (FSG) layer as a first dielectric layer 20, a silicon rich oxide layer 30 having a thickness between about 500 angstroms to 2,000 angstroms as an etching stop layer 30, and a fluorinate silicate glass (FSG) layer as a second dielectric layer 40 on the metal layer 12. Then, a patterned third photoresist layer 90 is formed on the surface of the second dielectric layer 40 by using the photolithography and etching technique, wherein the patterned third photoresist layer 90 is provided with a larger size of the etching contact 92 to define the desired size of the trench.

Figure 2B:
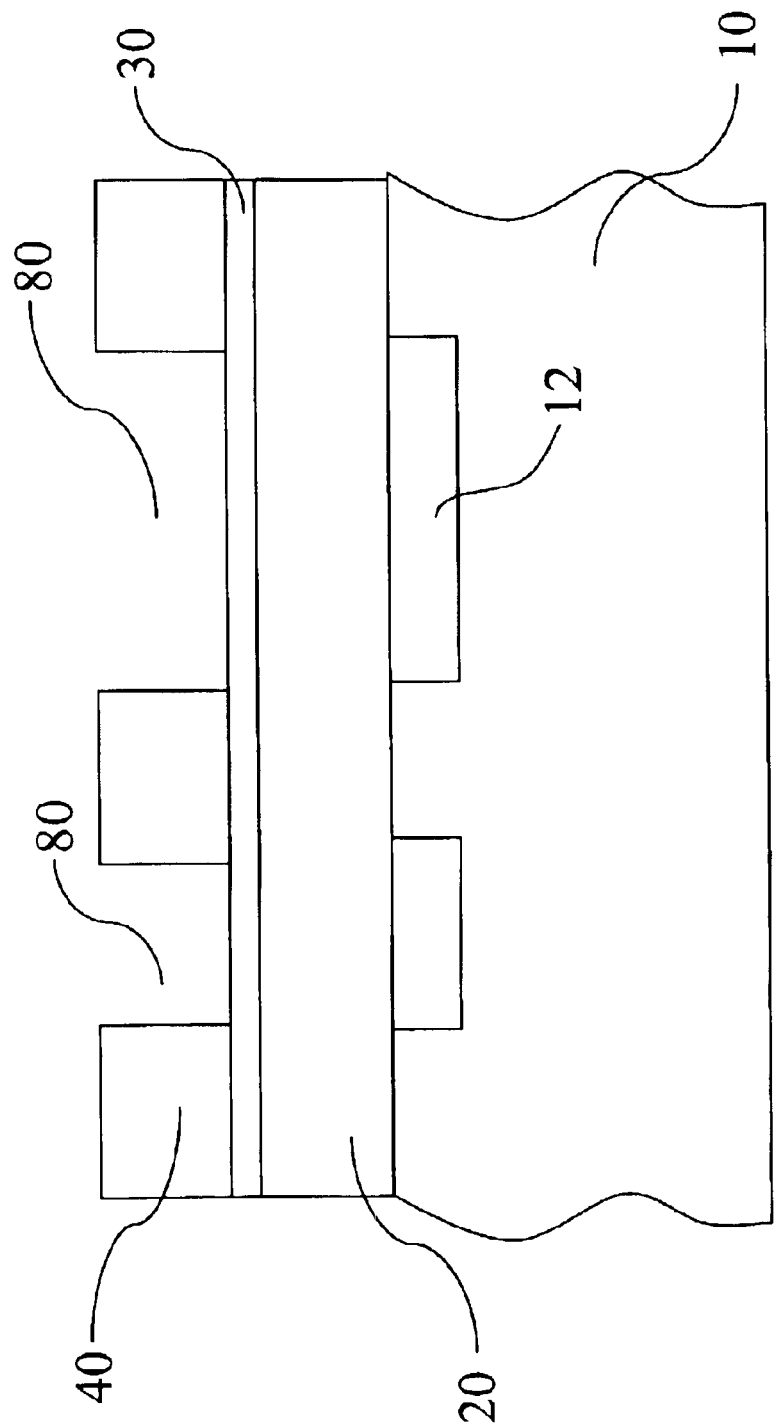

After defining the etching contact 92 of the trench first, the next step is using the patterned third photoresist layer 90 as a mask to etch and remove a portion of the second dielectric layer, which is exposed from the etching contact 92, to expose the silicon rich oxide layer 30. Then, after removing the patterned third photoresist layer 90, the present invention can obtain a trench 80 structure, such as shown in the FIG. 2B.

Figure 2C:
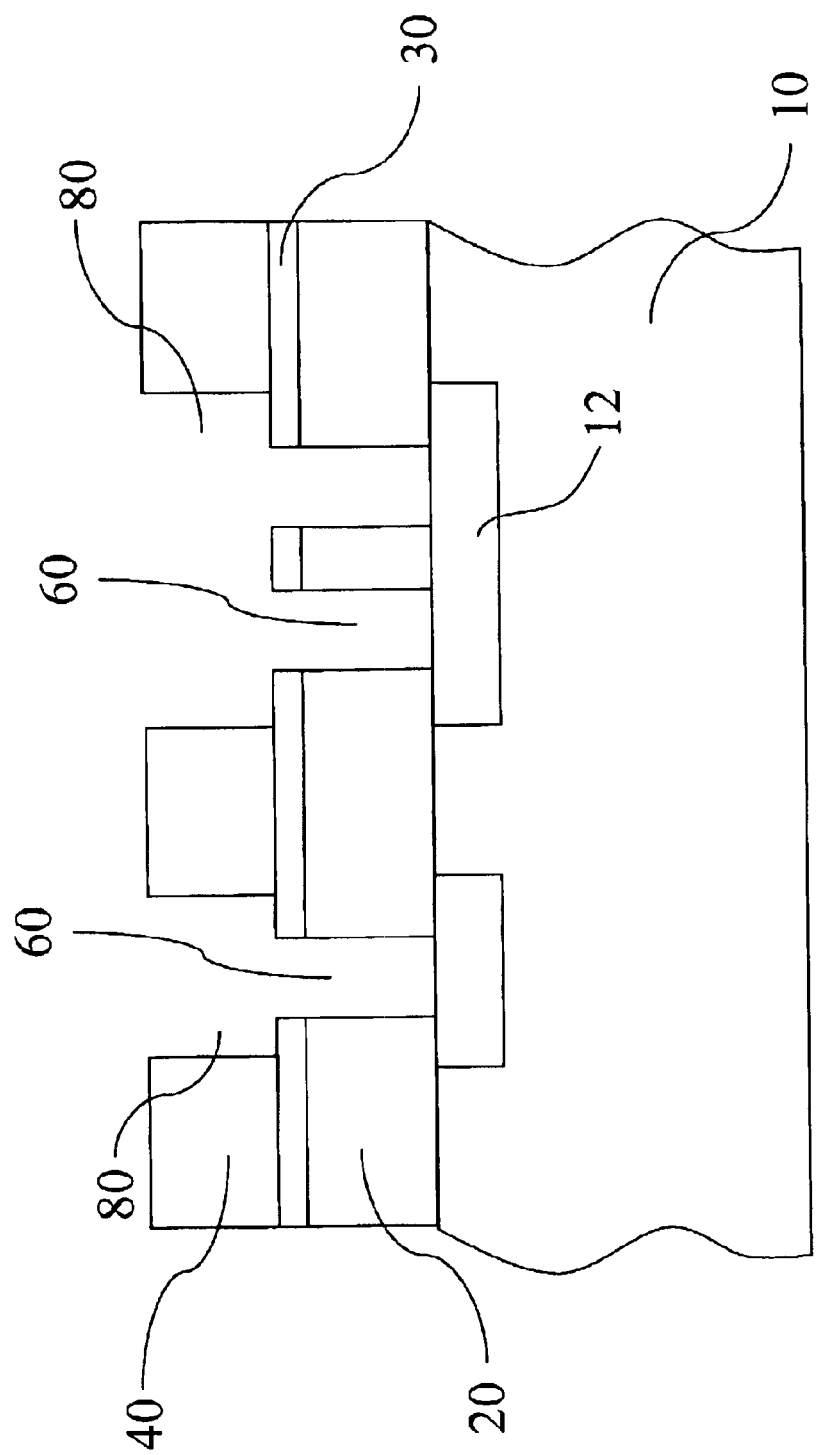

Referring to the FIG. 2C, after the step of removing the patterned third photoresist layer 90, the present invention utilizes a high selectivity of the dielectric layer to the silicon rich oxide layer to perform an etching step to remove a exposed portion of the silicon rich oxide layer and the first dielectric layer to expose the metal layer 12 to obtain a via hole 60 so as the present invention can obtain a dual damascene structure profile having the trench 80 and the via hole 60.

To sum of the forgoing, the present invention relates to a dual damascene processing method using a silicon rich oxide (SRO) layer as an etching stop layer in the step of etching the via contact and its structure. Because the present invention utilizes the silicon rich oxide layer as an etching stop layer and utilizes the high etching selectivity of the dielectric layer to the silicon rich oxide layer, so the present invention can achieve the good control of the depth and improve the trench profile. Combining the well-known process using silicon nitride layer as the etching stop layer, the present invention does not increase the dielectric constant index (K) of the inter metal dielectric (IMD). Besides, the present invention can effectively control the trench profile and depth, so the present invention can achieve a better trench microloading and better bottom profile. Furthermore, the present invention improves the function and operation speed of the devices without increasing the processing difficult in the manufacturing process.

Both embodiments mentioned above are to use in a one-level via contact as an example to explain the present invention. However, the present invention also can solve and apply to the two-level via contact, three-level via contact, or the subsequent via contact processes.

The forgoing description of the embodiments of the invention has been presented for purposes of illustration and description, and is not intended to be exhaustive or to limit the invention to he precise from disclosed. The description was selected to best explain the principles of the invention and practical application of these principles to enable others skilled in the art to best utilize the invention in various embodiments and modifications as are suited to the particular use contemplated. It is intended that the scope of the invention not to be limited by the specification, but be defined by the claim set forth below.

What is claimed is:

1. A dual damascene processing method using a silicon rich oxide (SRO) layer, which is suitable for a semiconductor substrate having metal connections therein, said dual damascene processing method comprising the steps of:

forming a metal layer on said semiconductor substrate and sequentially forming a first dielectric layer, said silicon rich oxide layer, and a second dielectric layer on said metal layer;

forming a patterned first photoresist layer on said second dielectric layer as a mask for etching and removing said second dielectric layer, said silicon rich oxide layer, and a portion of said first dielectric layer to form a via hole;

removing said patterned first photoresist layer;

forming a patterned second photoresist layer directly on said second dielectric layer to define a trench size, wherein said trench size is larger than said via hole; and using said patterned second photoresist layer as a mask, performing a trench etching, wherein said trench etching utilizes a high etching selectively of the dielectric of said first and second dielectric layers to said silicon rich oxide to remove an exposed second dielectric layer and a remaining portion of said first dielectric layer and to stop etching on said silicon rich oxide layer to obtain a dual damascene structure profile.

2. The dual damascene processing method according to claim 1, further comprising the step of forming a protect layer between said semiconductor substrate and said first dielectric layer.

3. The dual damascene processing method according to claim 1, wherein said first dielectric layer is made of fluorinated silicate glass (FSG).

4. The dual damascene processing method according to claim 1, wherein said second dielectric layer is made of fluorinated silicate glass (FSG).

5. The dual damascene processing method according to claim 1, wherein the step of forming said first dielectric layer, said silicon rich oxide layer, and said second dielectric layer uses a method selected from the group consisting of chemical vapor deposition method and physics vapor deposition method.

6. The dual damascene processing method according to claim 1, wherein reaction gases of said trench etching are carbon fluoride, argon, carbon monoxide, and oxygen.

7. The dual damascene processing method according to claim 1, wherein a reflect index of said silicon rich oxide layer is larger than 1.66.

8. The dual damascene processing method according to claim 1, wherein a thickness of said silicon rich oxide layer is between about 500 angstroms and 2,000 angstroms.

9. The dual damascene processing method according to claim 1, wherein a dielectric constant index (K) of said silicon rich oxide layer is about 4.

10. The dual damascene processing method according to claim 1, wherein a selectivity of dielectric to silicon rich oxide is larger than 2.

11. A dual damascene processing method using a silicon rich oxide (SRO) layer, said dual damascene processing method comprising:

forming at least a metal layer on a semiconductor substrate and sequentially forming a first dielectric layer, said silicon rich oxide layer, and a second dielectric layer on said metal layer, said first dielectric layer, silicon rich oxide layer and second dielectric layer having respective thickness thereof;

forming a trench extending through the entire thickness of said second dielectric layer to expose said silicon rich oxide layer; and upon creating said trench, forming a via hole extending through the entire thickness of said silicon rich oxide layer and the entire thickness of said first dielectric layer using a etching step of a high etching selectivity of the dielectric of said first and second dielectric layers to silicon rich oxide to remove said exposed silicon rich oxide layer and said first dielectric layer to expose said metal layer, thereby forming a dual damascene structure profile having said trench and said via hole.

12. The dual damascene processing method according to claim 11, further comprising the step of forming a protect layer between said semiconductor substrate and said first dielectric layer.

13. The dual damascene processing method according to claim 11, wherein said first dielectric layer is made of fluorinated silicate glass (FSG).

14. The dual damascene processing method according to claim 11, wherein said second dielectric layer is made of fluorinated silicate glass (FSG).

15. The dual damascene processing method according to claim 11, wherein the step of forming said first dielectric layer, said silicon rich oxide layer, and said second dielectric layer uses a method selected from the group consisting of chemical vapor deposition method and physics vapor deposition method.

16. The dual damascene processing method according to claim 11, wherein reaction gases of said etching step are carbon fluoride, argon, carbon monoxide, and oxygen.

17. The dual damascene processing method according to claim 11, wherein a reflect index of said silicon rich oxide layer is larger than 1.66.

18. The dual damascene processing method according to claim 11, wherein the thickness of said silicon rich oxide layer is between about 500 angstroms and 2,000 angstroms.

19. The dual damascene processing method according to claim 11, wherein a dielectric constant index (K) of said silicon rich oxide layer is about 4.

20. The dual damascene processing method according to claim 11, wherein a selectivity of dielectric to silicon rich oxide is larger than 2.

* * * * *